United States Patent [19]
Araki et al.

[11] Patent Number: 5,295,044
[45] Date of Patent: Mar. 15, 1994

[54] SEMICONDUCTOR DEVICE

[75] Inventors: Kouji Araki, Yokohama; Shinjiro Kojima, Chigasaki; Wataru Takahashi, Tokyo, all of Japan

[73] Assignee: Kabushiki Kaisah Toshiba, Kawasaki, Japan

[21] Appl. No.: 950,899

[22] Filed: Sep. 25, 1992

[30] Foreign Application Priority Data

Sep. 26, 1991 [JP] Japan .............................. 3-274764

[51] Int. Cl.$^5$ .............................................. H05K 7/20
[52] U.S. Cl. .................................... 361/709; 174/52.4; 257/713; 361/719
[58] Field of Search ...................... 361/386–389, 361/412, 413, 395, 704, 709, 712, 717, 718, 719, 720, 721, 735, 736, 744; 174/52.2, 52.4; 257/706, 707, 712, 713 X, 686, 693; 165/80.3, 185; 439/485

[56] References Cited

U.S. PATENT DOCUMENTS

| | | | |
|---|---|---|---|
| 4,356,532 | 10/1982 | Donaher et al. | 361/396 |
| 4,956,746 | 9/1990 | Gates, Jr. et al. | 361/396 |
| 4,969,066 | 11/1990 | Eibl et al. | 361/413 |
| 5,057,971 | 10/1991 | Hautvast et al. | 361/395 |
| 5,101,322 | 3/1992 | Ghaem et al. | 361/386 |
| 5,172,303 | 12/1992 | Bernardoni et al. | 174/52.4 |

*Primary Examiner*—Gerald P. Tolin
*Attorney, Agent, or Firm*—Finnegan, Henderson, Farabow, Garrett & Dunner

[57] ABSTRACT

A plurality of circuit boards are used and frames are attached to the circuit boards to surround the peripheral portions thereof. Since connection terminals electrically connected to the respective circuit boards are attached to the respective frames, a semiconductor device having semiconductor elements mounted at high density can be formed by stacking the first and second frames on each other and setting the respective connection terminals in contact with each other to electrically connect the circuit boards to each other.

14 Claims, 5 Drawing Sheets

SEMICONDUCTOR DEVICE

BACKGROUND OF THE INVENTION

1. Field of the Invention

The present invention relates to a semiconductor device and a method of manufacturing the same and, more particularly, to a semiconductor device having a power circuit such as a power source voltage generating circuit which includes power transistors and power ICs (which are hereinafter referred to as "power elements") and a control circuit which is provided for the power circuit and includes integrated circuit elements having no power elements and a method of manufacturing the same.

2. Description of the Related Art

A conventional semiconductor device, particularly, a module product has a circuit pattern formed on a single circuit board and a plurality of pellets including ICs, LSIs or the like mounted on the circuit board. The electrical connection between the pellets can be made by electrically connecting the electrodes and circuit patterns of the respective pellets to each other. After this, the circuit board is resin-sealed together with the pellets. At present, the technique of mounting the semiconductor device at a high density is rapidly developed. Relatively severe conditions which permit a large number of pellets to be mounted on the smallest possible package and permit power elements and integrated circuit elements (which are hereinafter referred to as "control elements") used in the control circuit as the mounting semiconductor elements are required to the package. Further, it is required to use a power element having a large power consumption and mount a plurality of power circuits in a single package. Consequently, it becomes strongly required to enhance the heat radiation efficiency.

Figure 1:
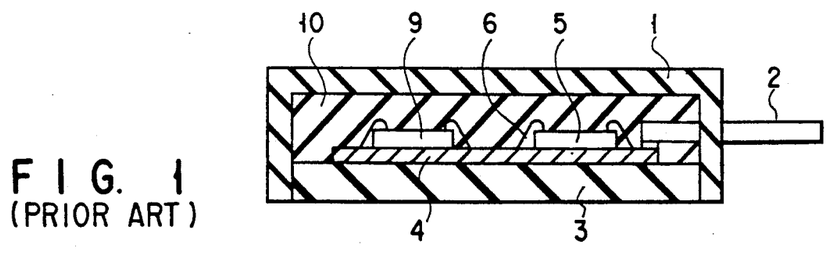
FIG. 1 is a cross sectional view showing one example of the construction of a conventional semiconductor device.

The above conventional module product is explained with reference to FIG. 1. Semiconductor elements (pellets) 5 and 9 are mounted on a circuit board 4. The pellets are electrically connected to a circuit pattern formed on the circuit board 4 via respective bonding wires 6. The pellet 5 includes a power element and tends to generate a large amount of heat. The pellet 5 is thus referred to as a "power pellet" in the following description. The pellet 9 corresponds to a control circuit including normal control elements. Signals from the power pellet 5 are, for example, supplied to an external lead 2 connected to the other pellet 9 and external circuit through the bonding wire 6 and the circuit pattern of the circuit board 4. The circuit board 4 is fixed on a heat radiating device (heat sink) 3 for radiating heat generated from the pellet to the exterior. The heat sink 3 having the circuit board 4 is coated with and protected by a cove 1 formed of plastic resin or the like. Since the semiconductor device is generally formed of a single circuit board, it is impossible to sufficiently cope with the high-density mounting.

Under the severe conditions of the reduced package size and the enhanced mounting density, there is a limitation on the number of pellets which can be mounted on the single board. Further, since a single board is used, it is difficult to mount the control element together with the power element unless a particular structure which may be obtained by attaching a heat spreader, for example, is provided. In order to enhance the mounting density, it can be easily considered to stack a plurality of boards having elements mounted thereon and this is possible in the normal printed circuit. However, in the semiconductor device which includes a power element and tends to generate heat, heat radiation devices must be attached to the respective circuit boards. As a result, it is difficult to realize such a structure and therefore the above idea is not realized until now.

SUMMARY OF THE INVENTION

An object of the present invention is to provide a semiconductor device in which a plurality of circuit boards which tends to generate heat can be easily stacked by constructing the plurality of circuit boards in a three-dimensional form and electrically connecting them.

According to an aspect of the present invention, there is provided a semiconductor device comprising: a first circuit board having a first frame attached to the peripheral portion thereof; a second circuit board stacked on the first circuit board and having a second frame attached to the peripheral portion thereof; semiconductor elements mounted on the first and second circuit boards; first electrical connection means formed on the first frame and electrically connected to the first circuit board; and second electrical connection means formed on the second frame, electrically connected to the second circuit board and electrically connected to the first electrical connection means by stacking the first and second frames on each other.

According to another aspect of the present invention, there is provided a semiconductor device comprising: a lowermost circuit board having a first frame attached to the peripheral portion thereof; an intermediate circuit board of at least one layer stacked on the lowermost circuit board and having a second frame attached to the peripheral portion thereof; an uppermost circuit board stacked on the intermediate circuit board and having a third frame attached to the peripheral portion thereof; semiconductor elements formed on the respective circuit boards; first electrical connection means formed on the first frame and electrically connected to the lowermost circuit board; second electrical connection means formed on the second frame, electrically connected to the intermediate circuit board and electrically connected to the first electrical connection means when the second frame is stacked on the first frame; and third electrical connection means formed on the third frame, electrically connected to the uppermost circuit board and electrically connected to the second electrical connection means when the third frame is stacked on the second frame.

According to still another aspect of the present invention, there is provided a method of manufacturing a semiconductor device comprising the steps of: disposing a plurality of first and second leads at a regular interval in first and second molds, respectively; filling insulative material into the molds and curing the insulative material to form first and second frames having the plurality of first and second leads attached thereto; machining the first and second leads to form first and second electrical connection means on the first and second frames, respectively; mounting first and second circuit boards on the first and second frames, respectively; forming semiconductor elements including at least one of integrated circuit elements and power elements on the first and second circuit boards; electrically connecting the first and second circuit boards to the first and second electrical connection means, respectively; and connecting the first electrical connection means to the second electrical connection means by stacking the first and second frames on each other.

Since the circuit boards are stacked on one another by use of the frames having the electrical connection means and are electrically connected to one another, the circuit boards for the semiconductor device in which control elements and power elements are formed together can be easily stacked on one another. The mounting density can be therefore enhanced. Further, if the circuit board on which power elements are mainly formed is provided separately from the circuit board on which control elements included in the control circuit are mainly formed, the influence of heat from the power elements on the control elements can be reduced. In this case, since it is not necessary to attach a heat radiation device to the latter circuit board, the circuit boards can be stacked on one another with the heat radiation efficiency kept high even if a heat radiating device is attached to the former circuit board.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described a semiconductor device according to embodiments of the present invention with reference to the accompanying drawings.

Figure 2:
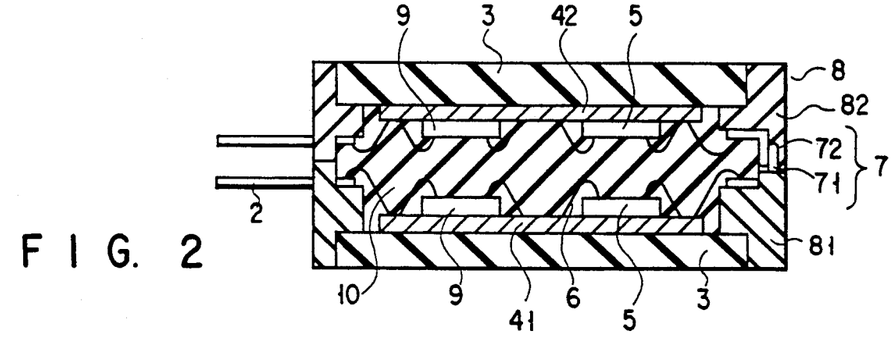
FIG. 2 is a cross sectional view showing the construction of a semiconductor device according to a first embodiment of the present invention.
Figure 3:
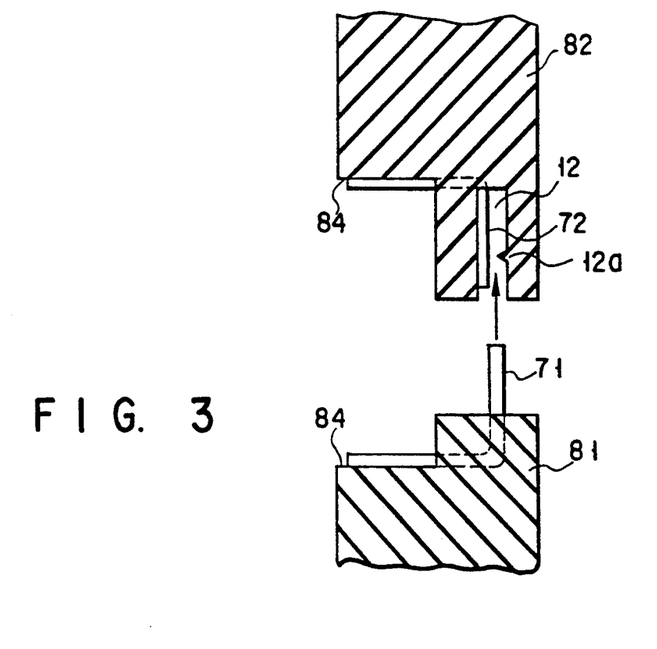
FIG. 3 is a partial cross sectional view showing the semiconductor device according to the first embodiment of the present invention shown in FIG. 2.

FIG. 2 is a cross sectional view of a semiconductor device according to a first embodiment of the present invention. FIG. 3 is an enlarged cross sectional view showing a connecting portion shown n FIG. 2. The semiconductor device includes a pair of circuit boards 41 and 42. A pellet 9 having control elements without power elements as semiconductor elements and a power pellet 5 having power elements are formed together on each of the circuit boards 41 and 42. The circuit boards may be formed with exactly the same circuit construction or with different circuit constructions from each other. The circuit boards 41 and 42 of the first embodiment are respectively fixed on heat sinks 3. The peripheral portion of the heat sink 3 for fixing the circuit board is supported and fixed on a frame 8. The frame 8 has a shoulder portion 84. External leads 2 connected to an external circuit are fixed on the shoulder portion 84 lying on the left side, in FIG. 2. Further, internal connection leads 7 with terminals 71, 72 for electrically connecting the first and second frames 81 and 82 to each other are fixed on the shoulder portions 84 lying on the right side in FIG. 2. A conventional fixing method using organic bonding agent can be used. A pair of circuit boards 41 and 42 are respectively mounted on the first and second frames 81 and 82. The first and second circuit boards are electrically connected to each other by connecting the connection means to each other and stacked with the pellets which are mounted on the respective base plates facing each other.

The connection structure in the first embodiment of FIG. 2 is explained in detail with reference to FIG. 3. The first connection terminals 71 formed in the internal connection lead form are attached to the first frame 81. The second connection terminals 72 formed in the internal connection lead form are attached to the second frame 82. The connection terminals 71 and 72 are fixed on the shoulder portions 84 of the respective frames. The front end portion of the first connection terminal 71 is exposed. The front end portion of the second connection terminal 72 is formed in the groove formed in the projecting portion of the second frame 82 and is connected to a portion fixed on the shoulder portion 84. In order to connect the first frame 81 and the second frame 82 to each other, the second frame 82 is set on the first frame 81 with the pellets 5 and 9 thereof facing those of the frame 81. At this time, the front end portion of the first connection terminal 71 is inserted into the groove 12 formed in the projecting portion of the second frame 82 and set in contact with the second connection terminal 72. In order to electrically connect the connection terminals to each other with certainty, a projection 12a is formed on the inner wall of the groove 12. When the first connection terminal 72 is inserted into the groove 12, the projeciton 12a may press the first connection terminal 71 against the second connection terminal 72. Thus setting the first connection terminal 71 is set in close contact with the second connection terminal 72. Since the circuit boards 41 and 42 are stacked on each other by use of the frames 81 and 82 having the electrical connection means, the mounting with high density can be easily realized. Further, since the circuit boards are stacked in such a condition that the surfaces thereof on which the pellets 5 and 9 having the semiconductor elements are set to face each other, all of the heat sinks 3, which are the heat radiating devices mounted on the circuit boards, are mounted with the heat radiation surfaces facing the outside. Therefore the heat radiating characteristic of the semiconductor device will not be deteriorated. In order to connect the pellets 5 and 9 to the circuit patterns on the circuit boards 41 and 42, connect the external leads 2 to the circuit patterns and connect the internal connection leads 7 to the circuit patterns, bonding wires 6 of Al or Au are used. A space between the two stacked circuit boards 41 and 42 is not kept empty. The space and is filled with resin 10 such as silicone or epoxy resin to protect the pellets 9 and power pellets 5. The frame 8 is formed of resin material such as polyphenylene sulfide (PPS). It is also possible to use ceramic material such as alumina.

Figure 4A:
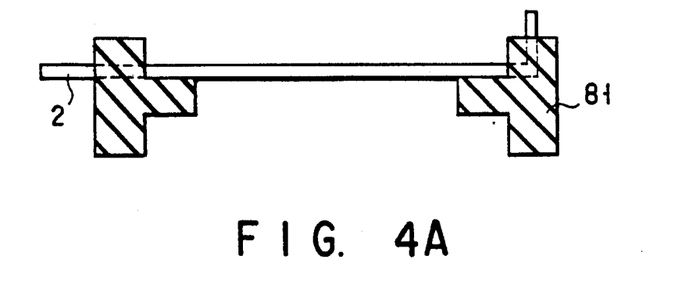
FIGS. 4A to 4D are cross sectional views for explaining the process of manufacturing the semiconductor device according to the first embodiment of the present invention.
Figure 4B:
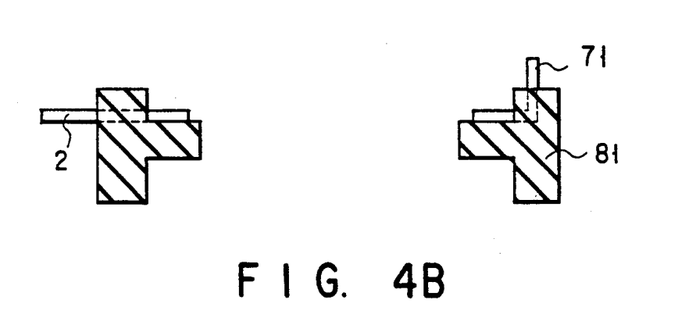
Figure 4C:
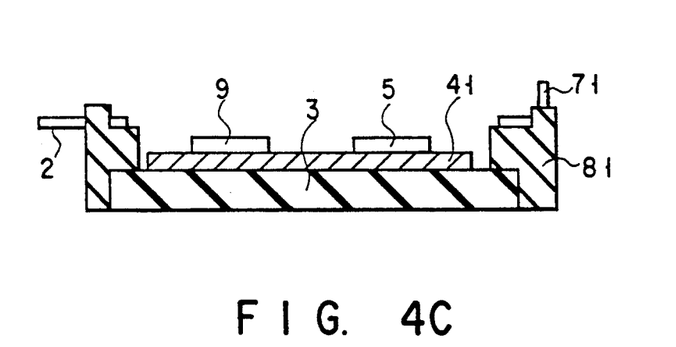
Figure 4D:
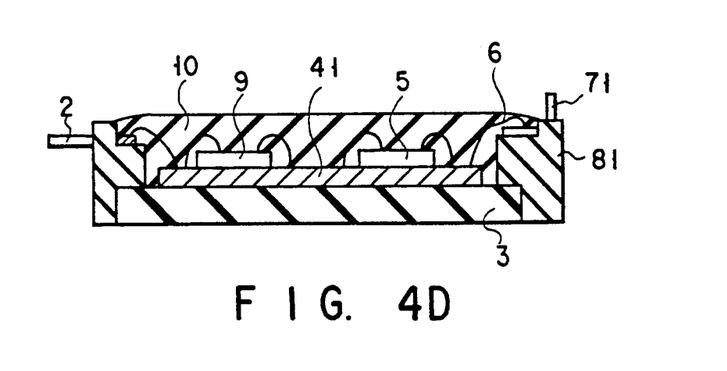

Next, a manufacturing method of the first embodiment is explained with reference to FIGS. 4A to 4D. As shown in FIG. 4A, a group of leads 2 are arranged at a regular interval in a direction perpendicular to the drawing and set in a heated mold (not shown). Resin such as PPS is then introduced into the mold to form a first frame 81 shown in FIG. 2. At that time, partially buried and fixed portions of the lead group 2 which are indicated by broken lines in FIG. 4A in the first frame 81 are formed. It is possible to form through holes, grooves and projections (not shown) in the portions of the lead group 2 which are indicated by the broken lines and buried in the resin. With this structure, the adhesion of the lead group 2 to the resin is significantly enhanced. One end portion of each of the leads of the lead group 2 is bent so that the front end portion thereof will vertically protrude from the first frame 81. Next, as shown in FIG. 4B, those portions of the leads of the lead group 2 which lie in the intermediate portion of the first frame 81 and held in space are cut off. As a result, each of the leads of the lead group 2 is divided into an external lead 2 and an internal connection lead 71. The external lead 2 horizontally extends out from the first frame 81. The lead 71 is connected to the circuit element and vertically protrudes from the first frame 81. The external lead 2 is formed of Cu with a thickness of approx. 0.4 mm in a pin shape. Then, as shown in FIG. 4C, a heat sink 3 on which a circuit board 41 formed of ceramic material such as Al$_2$O$_3$, for example, is mounted is attached to the first frame 81. The dimensions of the circuit board 41 are approx. 44 mm in depth, approx. 40 mm in width and approx. 0.635 mm in thickness, for example. The circuit pattern on the circuit board 41 is formed of a Cu plate which is approx. 0.15 mm to 0.2 mm thick and approx. 0.3 mm wide and the surface is plated with Ni or Au. It is also possible to form the circuit pattern by use of Cu plating instead of using the Cu plate. In this embodiment, a power pellet 5 having power elements as the semiconductor elements and a pellet 9 having control elements are mounted together on the circuit board 41. Thus, since the power pellet 5 is mounted on the circuit board 41, a large amount of heat will be generated therefrom and the heat radiating measure must be taken. For heat radiation purpose, the heat sink 3 formed of Cu or Al is attached to the rear surface of the circuit board 41. Since the heat sink 3 is larger than the circuit board 41, the heat sink 3 is connected to and fixed on the first frame 81 by use of bonding agent or the like. As shown in FIG. 4D, the pellets 5 and 9 and the circuit pattern on the circuit board 41 are electrically connected to one another via boding wires 6 of Al or the like. The external leads 2 and the first connection terminals 71 are also connected to the circuit pattern via the bonding wires 6. Epoxy resin or the like is then dropped on the circuit board 41 and cured to form a protection film 10. Silicone may be used as a material for forming the protection film. Materials used for forming a normal protection film may be used. The first frame 81 which has the first connection terminals 71 is connected to the second frame 82 having the second connection terminals 72 as shown in FIG. 2. The second frame 82 is formed by the same process as the process for forming the first frame 81, from the step of forming the frame having leads to the step of forming the protection film. However, second connection terminals 72 are formed in the internal connection lead portions. The first and second frames 81 and 82 with the above structures are coupled with each other, as shown in FIG. 3. The projection 12a in the groove of the second frame 82 makes the coupling between the two leads more stable. The dimensions of the package of the semiconductor device thus formed are 60 mm in depth and width and 20 mm in thickness. The protection film 10 may be formed by injecting resin into a space between the first and second frames 81 and 82 after they are stacked on each other.

Figure 5:
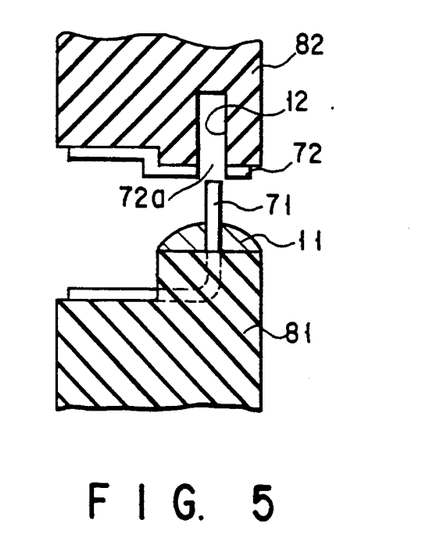
FIG. 5 is a cross sectional view showing the construction of a semiconductor device according to a second embodiment of the present invention.

Next, a second embodiment of the semiconductor device of invention is explained with reference to FIG. 5. FIG. 5 is a cross sectional view showing the main portion of the semiconductor device and shows the state of connection between the first and second frames 81 and 82. Like the first embodiment, the front end portion of the first connection terminal 71 of the first frame 81 vertically protrudes from the first frame 81. A conductive layer 11, for example, a layer of melt solder is formed around the first connection terminal 71 on the projecting surface as shown in FIG. 5 at the time of connection. The connection terminal 72 is horizontally formed on the second frame 82. A contact hole 72a is formed in the front end portion of the second connection terminal 72. The contact hole 72a is formed in position corresponding to the position in which an opening of the groove 12 is formed in the second frame 82 and has the same dimension as that of the opening. In order to stack the paired frames 81 and 82 together and electrically connect the frames to each other, the first connection terminal 71 is inserted into the groove 12 via the contact hole 72a formed in the second connection terminal 72. The solder layer 11 which is the conductive layer is then hardened to bond the connection leads to each other. The solder layer 11 makes the coupling between the two frames 81 and 82 more stable. The conductive material is not limited to solder, but a metal film and conductive resin or pressure sensitive conductive material may be used.

Figure 6:
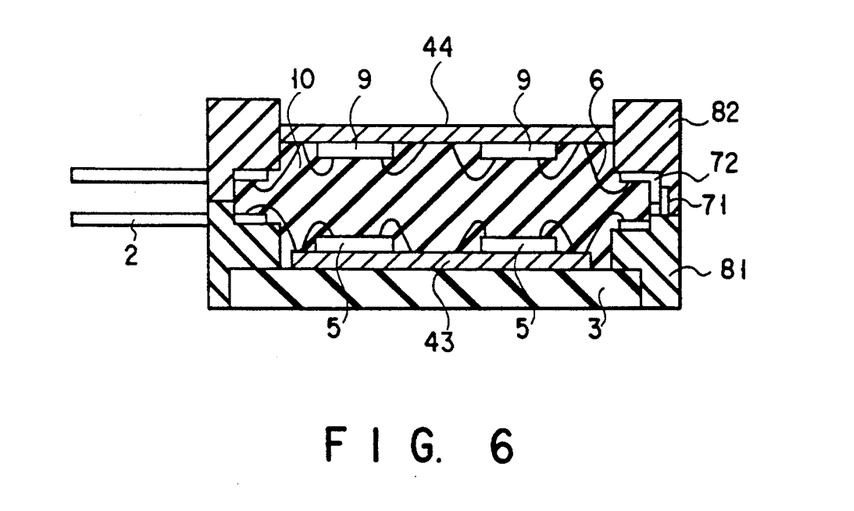
FIG. 6 is a cross sectional view showing the construction of a semiconductor device according to a third embodiment of the present invention.

Next, a third embodiment of the semiconductor device of the present invention is explained with reference to FIG. 6. Heat generation will not cause a serious problem in the control element. However, influence by heat generated by the power element must be taken into consideration. When the control element and power element are mounted together, special care must be taken by, for example, setting them in separated positions, thereby making it extremely difficult to enhance the mounting density. However, the above problem can be easily solved by applying the present invention. In the third embodiment, a circuit board 43 having only power elements and a circuit board 44 including control elements are used and stacked on each other. A heat radiating device is attached to the circuit board 43 to enhance the heat conductivity thereof. Fine circuit patterns are formed on the circuit board 44. The circuit board 43 having only the pellet 5 is mounted on the first frame 81 with the heat sink 3 disposed therebetween. The circuit board 44 is directly mounted on the second frame 82 to be stacked on the first frame 81 without a heat radiation device. The circuit board 44 mounted on the second frame 82 may be a normal printed circuit board or a multi-layered circuit board. A pellet 9 such as control elements is mounted on the circuit board 44 and elements such as power elements which have a heat generating tendency are not mounted thereon. Since the heat conductivity of one of the circuit boards can be enhanced and the other circuit board can be formed as a fine pattern circuit, the power elements can be easily formed together with the integrated circuit with a high integration density. Since the integrated circuit such as the control elements is thermally separated from the power elements to a considerable extent, the integrated circuit is not easily influenced by heat generated by the power elements and the reliability is high. Of course, both of the surfaces of the circuit boards are protected by protection insulative films 10 such as epoxy resin films.

Figure 7:
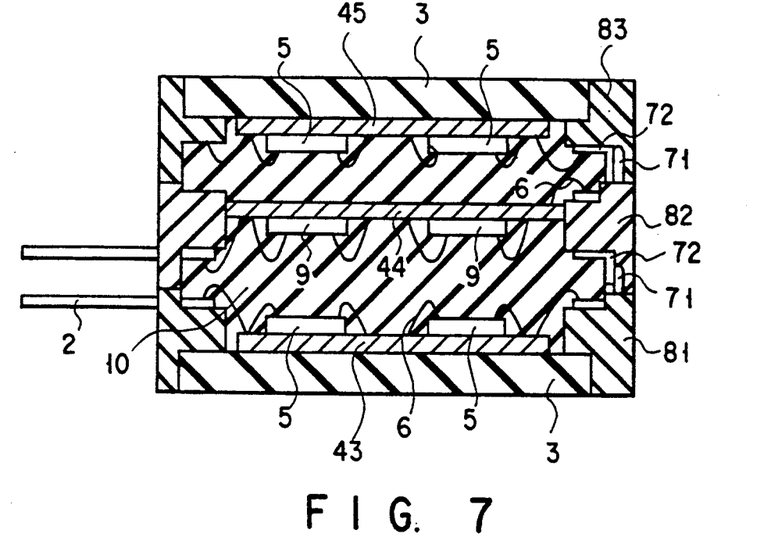
FIG. 7 is a cross sectional view showing the construction of a semiconductor device according to a fourth embodiment of the present invention.

Next, a fourth embodiment of the semiconductor device of the present invention is explained with reference to FIG. 7. The semiconductor device of the present invention explained in the above embodiments has a two-layered structure. If electrical connection means is formed on the frame to be stacked, more frames can be stacked, for example, a semiconductor device having three, four or more circuit boards stacked on one another can be provided. The semiconductor device of the fourth embodiment has a three-layered structure. In the fourth embodiment, a circuit board 43 attached to a heat sink 3 is mounted on a first frame 81 and only a pellet 5 having power elements is mounted on the circuit board 43. The circuit of the circuit board 43 is electrically connected to first connection terminals 71 and external leads 2 fixed on the first frame 81 through bonding wires 6. A second frame 82 is stacked on and electrically connected to the first frame 81. The second frame 82 is electrically connected to the first frame 81 via second connection terminals 72 fixed on the second frame 82. Only a pellet 9 having an integrated circuit including control elements is mounted on a circuit board 44 fixed on the second frame 82. The structure described above is the same as a corresponding structure of the third embodiment described with reference FIG. 6. However, the fourth embodiment is different from the third embodiment in that a third frame 83 is stacked on the second frame 82. In order to stack the third frame 83 on the second frame 82, it is necessary to form both of the second connection terminals 72 and the first connection terminals 71 on the under and top surfaces of the second frame 82, respectively. In the example shown in FIG. 7, the first connection terminals 71 are formed on the surface of the second frame 82 opposite to the surface on which the second connection terminals 72 are fixed. Second connection terminals 72 are formed on the third frame 82 to face the first connection terminals 71 attached to the second frame 82. The third frame 83 is stacked on the second frame 82, with the second connection terminals of the third frame 83 and the first connection terminals of the second frame 82 electrically connected each other. External leads can be formed on the third frame 83 as required, but in the fourth embodiment, a case wherein no external lead is provided is shown. In order to electrically connect the first connection terminals 71 of the second frame 82 to the control elements 9 of the second frame 82, it is preferable to use a multi-layered circuit board for the circuit board 44. Since a pad (not shown) formed on the under surface of the circuit board 44 can be connected to the first connection terminal 71 by use of the bonding wires 6, the connection between the circuit boards can be easily attained. The surfaces of the respective circuit boards are protected by protection insulative films 10 such as epoxy resin films. When three circuit boards are stacked on one another, it is difficult to effect the heat radiation process for the intermediate circuit board 44. However, the heat radiation process for the whole semiconductor device can be effectively effected by paying much attention to the arrangement of the pellets and mounting no elements having the heat generating tendency on the intermediate circuit board.

Figure 8A:
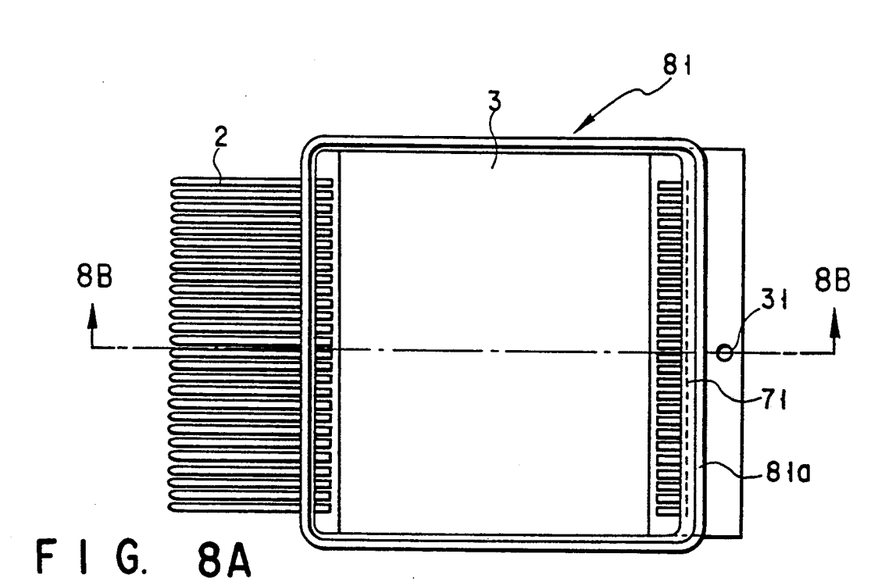
FIG. 8A is a plan view showing the construction of a semiconductor device according to a fifth embodiment of the present invention.
Figure 8B:
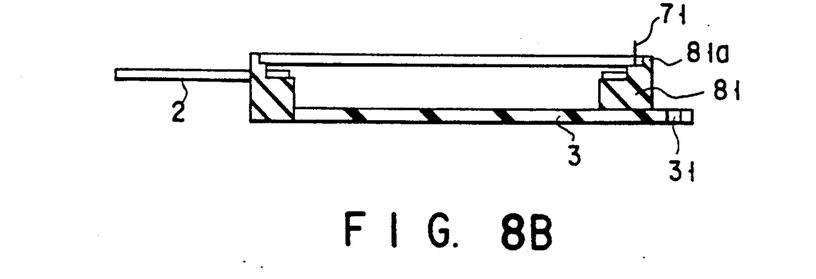
FIG. 8B is a cross sectional view taken along the line A—A' of FIG. 8A.
Figure 9:
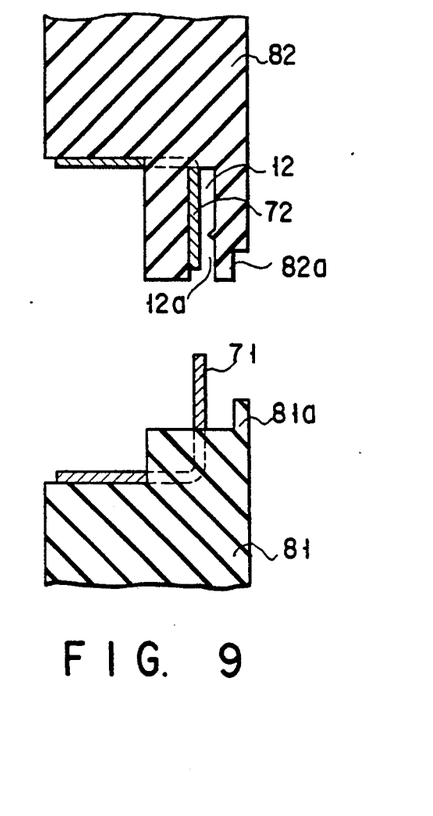
FIG. 9 is a partial cross sectional view of the semiconductor device according to the fifth embodiment of the present invention shown in FIG. 8A.

Next, a fifth embodiment of the semiconductor device of the present invention is explained with reference to FIGS. 8A, 8B and 9. FIG. 8A is a plan view of a frame. FIG. 8B is a cross sectional view taken along the line A—A' of FIG. 8A. FIG. 9 is a partial cross sectional view of a structure for connecting a first frame 81 shown in FIGS. 8A and 8B and a corresponding second frame 82 to each other. As shown in FIG. 8A, a plurality of external leads 2 and a plurality of first connection terminals are arranged to face each other. As shown in FIGS. 8B and 9, a projection 81a is formed on the outermost periphery of the first frame 81. The projection is made in parallel with the direction of the arrangement of the first connection terminals 71. As shown in FIG. 9, a groove 82a is formed in the outermost periphery of the second frame 82. Therefore, when the two frames 81 and 82 ar electrically connected to each other, the projection 81a and the groove 82a are engaged with each other and fixedly coupled together. The first frame 81 shown in FIGS. 8A and 8B has a structure which permits a heat radiation device, for example, a heat sink 3 to be easily mounted thereon. In the first embodiment shown in FIG. 2, the end face of the heat sink 3 is attached to the inner surface of the frame. However, in the fifth embodiment, the thicknesses of the sides of the frame in the vertical direction are set to different values, as shown in FIG. 8B. The end face of the heat sink 3 is attached to the inner surface of that portion of the frame on which the external leads 2 are fixed. Part of the heat sink 3 is also attached to the bottom surface of that portion of the frame on which the first connection terminals 71 are fixed. As a result, the heat sink 3 can be formed to extend to the exterior of the frame on the side of the first connection terminals 71. A mounting hole 31 for mounting the heat sink can be formed in the extended portion of the heat sink. A heat sink having a mounting hole or a heat sink, as shown in FIG. 2, may be used for the second frame 82 facing the first frame 81. Generally, a portion of the heat sink having the mounting hole 31 is attached to the bottom surface of the frame. A portion of the heat sink which does not require formation of the mounting hole is attached to the inside surface of the frame. In the fifth embodiment, a single mounting hole 31 is formed, but in practice, the number of mounting holes is not limited to one and a plurality of mounting holes can be formed. In some cases, four mounting holes are formed near the respective four sides of the frame. When it is necessary to form four mounting holes in the heat sink 3, the heat sink 3 is attached only to the bottom surface of the frame.

Figure 10:
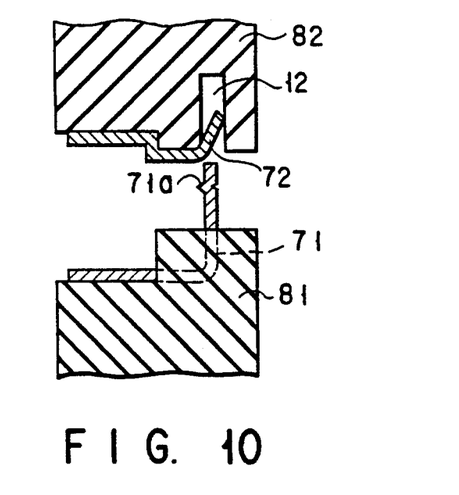
FIG. 10 is a cross sectional view showing the construction of a semiconductor device according to a sixth embodiment of the present invention.

A sixth embodiment of the semiconductor device of the present invention is explained with reference to FIG. 10. Electrical connecting means attached to the frame used in the present invention is not limited to the structure described in the above embodiments. Any technique well known in the art can be used. The sixth embodiment is one of the examples. If the first connection terminals 71 and second connection terminals 72 are once connected, they cannot be easily separated from each other. More specifically, the first connection terminals 71 fixed on a first frame 81 are formed to vertically project from the frame 81 and projections 71a are formed on the front end portions of the respective first connection terminals 71 by machining process. Second connection terminals 72 are fixed on a second frame 82. The front end portion of the second connection terminal 72 is bent and inserted into a groove 12 formed in the frame 82. The front end portions of the second connection terminals 72 are aligned with the projections 71a. Since the lead 72 has elasticity, it cannot be made completely vertical and is disposed to obliquely extend from one side of the groove 12 to the opposite side thereof. Therefore, when the first connection terminal 71 is inserted into the groove 12, the projection 71a on the front end portion thereof is inserted into the groove 12 more deeply than the front end of the second connection terminal 72, thereby preventing the lead 74 from being removed from the groove.

Power circuits constructed by the elements formed on the circuit board shown in the above embodiments includes, for example, a power source voltage generating circuit, a motor driving circuit and the like. A control circuit such as a detection circuit is provided together with the power circuits. Any material known in the art can be used for the circuit board. For example, a ceramic material such as $Al_2O_3$, AlN, SiC and BeO and glass epoxy resin having glass fibers impregnated with epoxy resin may be used. A circuit board such as an AlN circuit board having high heat conductivity is preferably used for heat radiation. In the former embodiments, the electrical connection between the circuit boards of the semiconductor device is made by setting the connection terminals in contact with each other. However, in the present invention, an intermediate body such as a spring may be disposed between the connection terminals. If a spring is inserted into the groove 12 acting as a guide in the first embodiment of FIG. 3, the electrical connection between the terminals can be made more stable. The resin film for protecting the semiconductor elements used in the above embodiments is not necessarily used. For example, when a ceramic material is used for the frame, a space defined by the frame and circuit board is not necessarily filled with the resin film unlike the embodiment of FIG. 2 by hermetically sealing the space between the heat radiating plate and frame.

As described above, in the present invention, since a circuit board having a three-dimensional structure can be used in the semiconductor device having the power elements, the mounting density of elements for the unit area can be significantly enhanced. Since a circuit including elements such as power elements having a relatively large heat generating tendency and a circuit including only elements having substantially no heat generating property, the elements having substantially no heat generating property will not be easily influenced by heat generated by the power elements even if they are disposed near the other elements. Therefore, the elements having the heat generating tendency and the elements having substantially no heat generating tendency can be easily mounted together in a single package so that a highly reliable semiconductor device can be formed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a first circuit board assembly including a first circuit board on which power semiconductor elements are mounted and a first heat sink, having a first peripheral frame portion, for radiating heat generated by said power semiconductor elements, said first circuit board being fixed on one surface of said first heat sink and within said first peripheral frame portion;
   a second circuit board assembly including a second circuit board on which non-power semiconductor elements are mounted and a second heat sink, having a second peripheral frame portion, for radiating heat generated by said non-power semiconductor elements, said second peripheral frame portion of said second circuit board assembly being stacked on said first peripheral frame portion of said first circuit board assembly so as to oppose said first circuit board to said second circuit board;
   first electrical connection means formed on said first peripheral frame portion and electrically connected to said first circuit board; and
   second electrical connection means formed on said second peripheral frame portion, electrically connected to said second circuit board and electrically connected to said first electrical connection means by stacking said first and second peripheral frame portions on each other.

2. A semiconductor device according to claim 1, wherein said first electrical connection means is formed of first leads, first ends of which project from said first peripheral frame portion and second ends of which are formed as bonding pads used for said first circuit board, said second electrical connection means is formed of second leads first ends of which are provided in a groove formed in said second peripheral frame portion and second ends of which are formed as bonding pads used for said second circuit board, and said first ends of said first leads are set in contact with said first ends of said second leads in said groove to electrically connect said first and second circuit boards to each other.

3. A semiconductor device according to claim 1, wherein said first electrical connection means is formed of first leads which project from said first peripheral frame portion and conductive layers formed on the surface of said first peripheral frame portion to respectively surround said first leads, said second electrical connection means is formed of second leads which are formed on the surface of said second peripheral frame portion and respectively have contact holes, and said first leads are inserted into said groove formed in said second peripheral frame portion via said respective contact holes to respectively set said second leads in contact with said conductive layers and first leads.

4. A semiconductor device according to claim 1, wherein said first peripheral frame portion has a projection and said second peripheral frame portion has a cut-out portion which is engaged with said projection when said first and second peripheral frame portions are stacked on each other so as to securely fix said second frame on said first frame.

5. A semiconductor device according to claim 2, wherein a projection which passes said first leads against said second leads is formed in said groove formed in said second peripheral frame portion.

6. A semiconductor device according to claim 2, wherein said projection engaged with said second leads to prevent said second leads from being removed when said first and second peripheral frame portions are stacked on each other is formed in a preset position of said first leads.

7. A semiconductor device according to claim 1, wherein the other surface of said first heat sink is formed to be exposed outwardly.

8. A semiconductor device according to claim 1, wherein said first heat sink and said second heat sink produce a sealed space into which a protective resin is filled when said first peripheral frame portion of said first heat sink and said second peripheral frame portion of said second heat sink are stacked.

9. A semiconductor device according to claim 8, wherein surfaces of said first peripheral frame portion and said second peripheral frame portion are bonded with a conductive adhesive material.

10. A semiconductor device comprising:
a lowermost circuit board assembly including a lowermost circuit board on which power semiconductor elements are mounted and a lowermost heat sink, having a lowermost peripheral frame portion, for radiating heat generated by said power semiconductor elements, said lowermost circuit board being fixed on one surface of said lowermost heat sink and within said lowermost peripheral frame portion;
an intermediate circuit board assembly of at least one layer including at least one intermediate circuit board on which non-power semiconductor elements are mounted and at least one intermediate peripheral frame portion to which said at least one intermediate circuit board is attached, said at least one peripheral frame portion of said intermediate circuit board assembly being stacked on said lowermost peripheral frame portion of said lowermost circuit board assembly;
an uppermost circuit board assembly including an uppermost circuit board on which power semiconductor elements are mounted and an uppermost heat sink, having an uppermost peripheral frame portion, for radiating heat generated by said power semiconductor elements, said uppermost circuit board being fixed on one surface of said uppermost heat sink and within said uppermost peripheral frame portion, and said uppermost peripheral frame portion of said uppermost circuit board assembly being stacked on said at least one intermediate peripheral frame portion of said intermediate circuit board assembly;
first electrical connection means formed on said lowermost peripheral frame portion and electrically connected to said lowermost circuit board;
second electrical connection means formed on said intermediate peripheral frame portion, electrically connected to said intermediate circuit board and electrically connected to said first electrical connection means; and
third electrical connection means formed on said uppermost peripheral frame portion, electrically connected to said uppermost circuit board and electrically connected to said second electrical connection means.

11. A semiconductor device according to claim 10, wherein said first electrical connection means is formed of first leads first ends of which project from said lowermost peripheral frame portion and second ends of which are formed as bonding pads used for said lowermost circuit board, said second electrical connection means is formed of first leads which project from one surface of said lowermost peripheral frame portion and second leads provided in a groove formed in the opposite surface of said intermediate peripheral frame portion, and said third electrical connection means is formed of third leads first ends of which are provided in a groove formed in said uppermost peripheral frame portion, and said first leads are respectively set in contact with said second leads in said respective grooves to electrically connect said first, second and third circuit boards to one another.

12. A semiconductor device according to claim 10, wherein the other surface of said uppermost and lowermost heat sinks are formed to be exposed outwardly.

13. A semiconductor device according to claim 10, wherein said lowermost heat sink and said uppermost heat sink produce a sealed space into which a protective resin is filled when said lowermost peripheral frame portion said intermediate peripheral frame portion and said uppermost peripheral frame portion are stacked.

14. A semiconductor device according to claim 13, wherein surfaces of said lowermost peripheral frame portion, said intermediate peripheral frame portion and said uppermost peripheral frame portion are bonded with a conductive adhesive material.

* * * * *